(12) United States Patent
Yang et al.

(10) Patent No.: US 7,705,755 B2
(45) Date of Patent: Apr. 27, 2010

(54) SIGNAL CONVERTING APPARATUS WITH BUILT-IN SELF TEST

(75) Inventors: Chao-Chi Yang, Hsin-Chu (TW); Yao-Ren Fan, Chiayi County (TW)

(73) Assignee: Elan Microelectronics Corporation, Science Industrial Park, HsinChu (TW)

( * ) Notice: Subject to any disclaimer, the term of this patent is extended or adjusted under 35 U.S.C. 154(b) by 207 days.

(21) Appl. No.: 11/965,752

(22) Filed: Dec. 28, 2007

(65) Prior Publication Data

US 2008/0158028 A1 Jul. 3, 2008

(30) Foreign Application Priority Data

Dec. 29, 2006 (TW) ............................... 95149868 A
Dec. 19, 2007 (TW) ............................... 96148639 A (51) Int. Cl.
*H03M 1/10* (2006.01)
(52) U.S. Cl. ....................... 341/120; 341/118; 341/121; 341/143; 341/155; 341/172
(58) Field of Classification Search ......... 341/118–121, 341/143, 155, 163, 172
See application file for complete search history.

(56) References Cited

U.S. PATENT DOCUMENTS

| | | | | |
|---|---|---|---|---|
| 5,984,487 | A * | 11/1999 | McGhee | 362/507 |
| 6,144,331 | A * | 11/2000 | Jiang | 341/172 |
| 6,433,727 | B1 * | 8/2002 | Yoshinaga | 341/172 |
| 6,674,386 | B2 * | 1/2004 | Carreau et al. | 341/155 |
| 7,038,609 | B1 * | 5/2006 | Hurrell | 341/156 |
| 7,081,841 | B1 * | 7/2006 | Feist et al. | 341/120 |
| 7,158,070 | B1 * | 1/2007 | Yang et al. | 341/163 |
| 7,161,512 | B1 * | 1/2007 | Keskin | 341/118 |
| 2006/0066464 | A1 * | 3/2006 | San et al. | 341/155 |
| 2006/0284750 | A1 * | 12/2006 | Keskin | 341/120 |
| 2007/0182612 | A1 * | 8/2007 | Peterson et al. | 341/144 |
| 2008/0198056 | A1 * | 8/2008 | Hurrell | 341/155 |
| 2009/0109079 | A1 * | 4/2009 | Ahmad | 341/156 |

* cited by examiner

*Primary Examiner*—Linh V Nguyen
(74) *Attorney, Agent, or Firm*—Winston Hsu (57) ABSTRACT

The present invention provides a signal converting apparatus with built-in self test, including a first signal converting circuit, a second signal converting circuit, a comparing apparatus, a control logic apparatus and a voltage divider. The first and the second signal converting circuit take a first and a second reference voltage and are respectively controlled by a first and second set of control signals from the control logic apparatus for the comparing apparatus to generate a comparing result.

12 Claims, 6 Drawing Sheets

SIGNAL CONVERTING APPARATUS WITH BUILT-IN SELF TEST

BACKGROUND OF THE INVENTION

1. Field of the Invention

The present invention relates to an analog-to-digital converter with built-in self test, and more particularly, to an analog-to-digital converter performs a mutual test between capacitor arrays to detect if the capacitor array and related circuitry conform to the desired resolution requirement, and then utilizes the capacitor array, which has been completely tested, to detect if a resistor string conforms to another resolution requirement of the analog-to-digital converter.

2. Description of the Prior Art

Regarding the test of integrated linearity error (INL) of a conventional n-bit successive approximation register analog-to-digital converter (SAR ADC), an additional ramp generator is required for the built-in self test purposes, which increases the chip area greatly. However, if an external analog testing station is alternatively employed, the test cost is increased inevitably and the test is very time-consuming.

SUMMARY OF THE INVENTION

Regarding an n-bit analog-to-digital converter, the present invention uses a binary weighted capacitor array to realize m bits corresponding to most significant bits (MSBs) of the analog-to-digital converter, and uses a resistor string to determine remaining (n−m) bits corresponding to least significant bits (LSBs) of the analog-to-digital converter. In order to meet the integrated linearity error (INL) requirement of $-1LSB \leq INL \leq 1LSB$, the relative capacitor error within the capacitor array must satisfy at least n-bit resolution requirement, and the resistor error in the resistor string must satisfy at least (n−m)-bit resolution requirement. As to the INL test of such an analog-to-digital converter architecture having capacitor arrays and resistor string included therein, the present invention performs a mutual test between capacitor arrays under a self test mode for monitoring relative error within the capacitor network. Due to the fact that peripheral circuits operated in a normal mode, such as a comparing device, switching devices, etc., are also used during the built-in self test, the resultant detected error includes error caused by the peripheral circuits. Next, the capacitor array, which has been completely tested, is used to monitor the relative error within the resistor string. In this way, the objective of estimating INL of an analog-to-digital converter is achieved.

According to an exemplary embodiment of the present invention, a signal converting apparatus with built-in self test is disclosed. The signal converting apparatus comprises a comparing device, a first signal converting circuit, a second signal converting circuit, a voltage dividing device, and a control logic device. The comparing device compares signals inputted to a first input terminal and a second input terminal to generate a comparing result. The first signal converting circuit is coupled to the first input terminal of the comparing device for receiving a first reference voltage under a normal mode or a self test mode, and generating a first comparing signal to the first input terminal of the comparing device according to a first set of control signals. The second signal converting circuit is coupled to the second input terminal of the comparing device for receiving a second reference voltage under the normal mode or the self test mode, and generating a second comparing signal to the second input terminal of the comparing device according to the first set of control signals. The voltage dividing device is coupled to the first and the second signal converting circuits for generating at least an analog signal according to a second set of control signals to the first and the second signal converting circuits under the normal mode or the self test mode. The control logic device is coupled to the comparing device, the first and the second signal converting circuits, and the voltage dividing device for generating the first set of control signals and the second set of control signals.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the description and following claims to refer to particular components. As one skilled in the art will appreciate, electronic equipment manufacturers may refer to a component by different names. This document does not intend to distinguish between components that differ in name but not function. In the following description and in the claims, the terms "include" and "comprise" are used in an open-ended fashion, and thus should be interpreted to mean "include, but not limited to . . . ". Also, the term "couple" is intended to mean either an indirect or direct electrical connection. Accordingly, if one device is coupled to another device, that connection may be through a direct electrical connection, or through an indirect electrical connection via other devices and connections.

Figure 1:
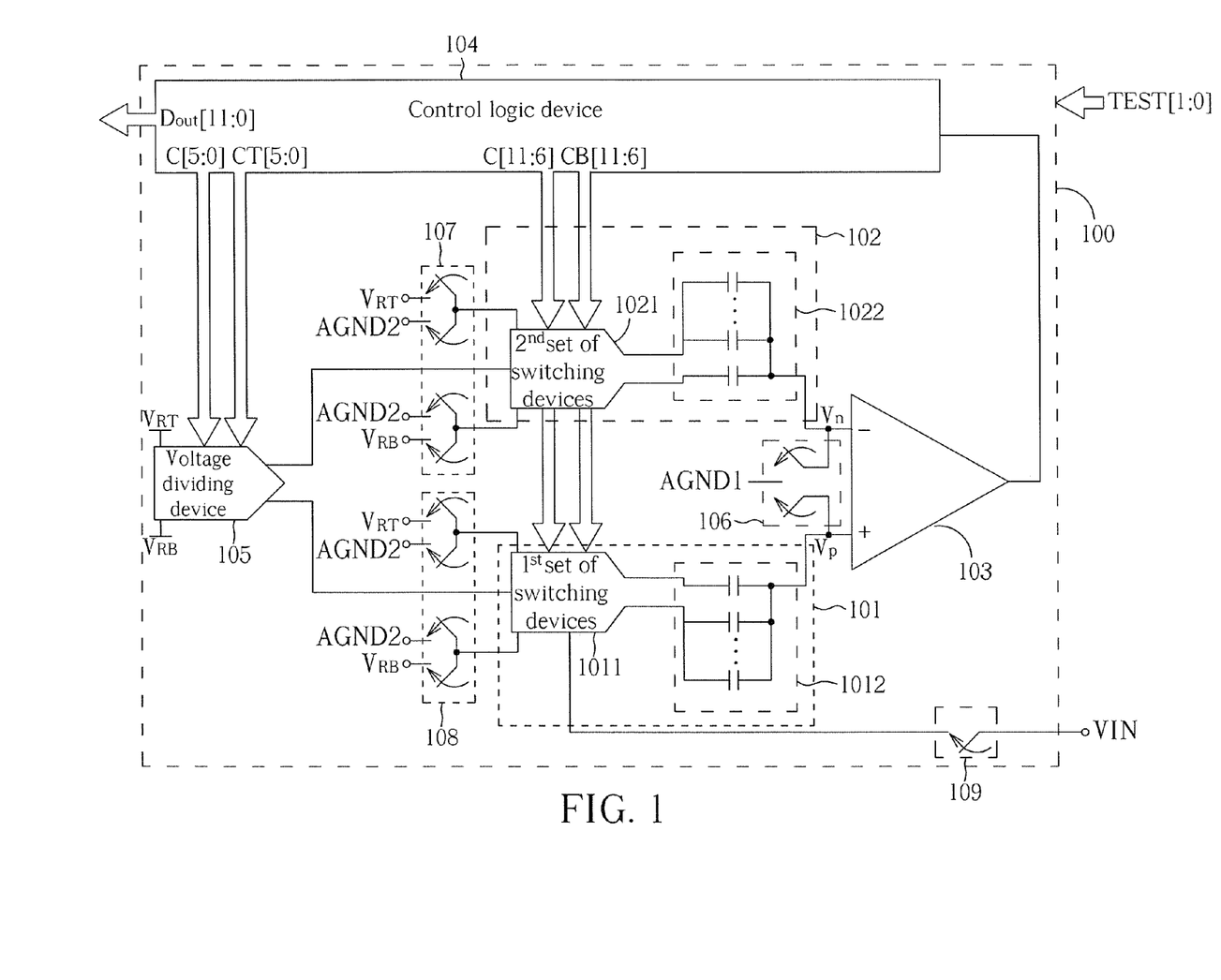
FIG. 1 is a simplified diagram illustrating a signal converting apparatus with built-in self test that is implemented using an architecture of an analog-to-digital converter with a single-ended input according to an exemplary embodiment of the present invention.

Please refer to FIG. 1. FIG. 1 is a block diagram illustrating a signal converting apparatus 100 with built-in self test according to an embodiment of the present invention. The exemplary signal converting apparatus 100 comprises a first signal converting circuit 101, a second signal converting circuit 102, a comparing device 103, a control logic device 104, a voltage dividing device 105, a fifth set of switching devices 106, a sixth set of switching devices 107, a seventh set of switching device 108, and an eighth set of switching device 109. Please note that although the signal converting apparatus 100 of the present invention is illustrated utilizing a 12-bit analog-to-digital converter, this is not meant to be a limitation of the present invention. In other words, the analog-to-digital converters having any other number of decoded bits also belong to the scope of the present invention. Additionally, each of the first signal converting circuit 101 and the second signal converting circuit 102 is implemented using a 6-bit capacitor-type digital-to-analog converter, and the voltage dividing device 105 has 64 ($2^6$) sets of voltage-dividing resistors implemented therein for providing divided voltages in response to corresponding 6-bit digital input. However, the first and second signal converting devices 101, 102 and the voltage dividing device 105 are not limited to operate according to 6-bit digital inputs. Instead, any bit combination resulting in a total bit number of 12 can be selected to design the first and second signal converting devices 101, 102 and the voltage dividing device 105. For example, each of the first and second signal converting devices 101, 102 is a 4-bit digital-to-analog converter, and the voltage dividing device 105 has 256 ($2^8$) sets of voltage-dividing resistors implemented therein for providing divided voltages in response to corresponding 8-bit digital inputs.

Figure 2:
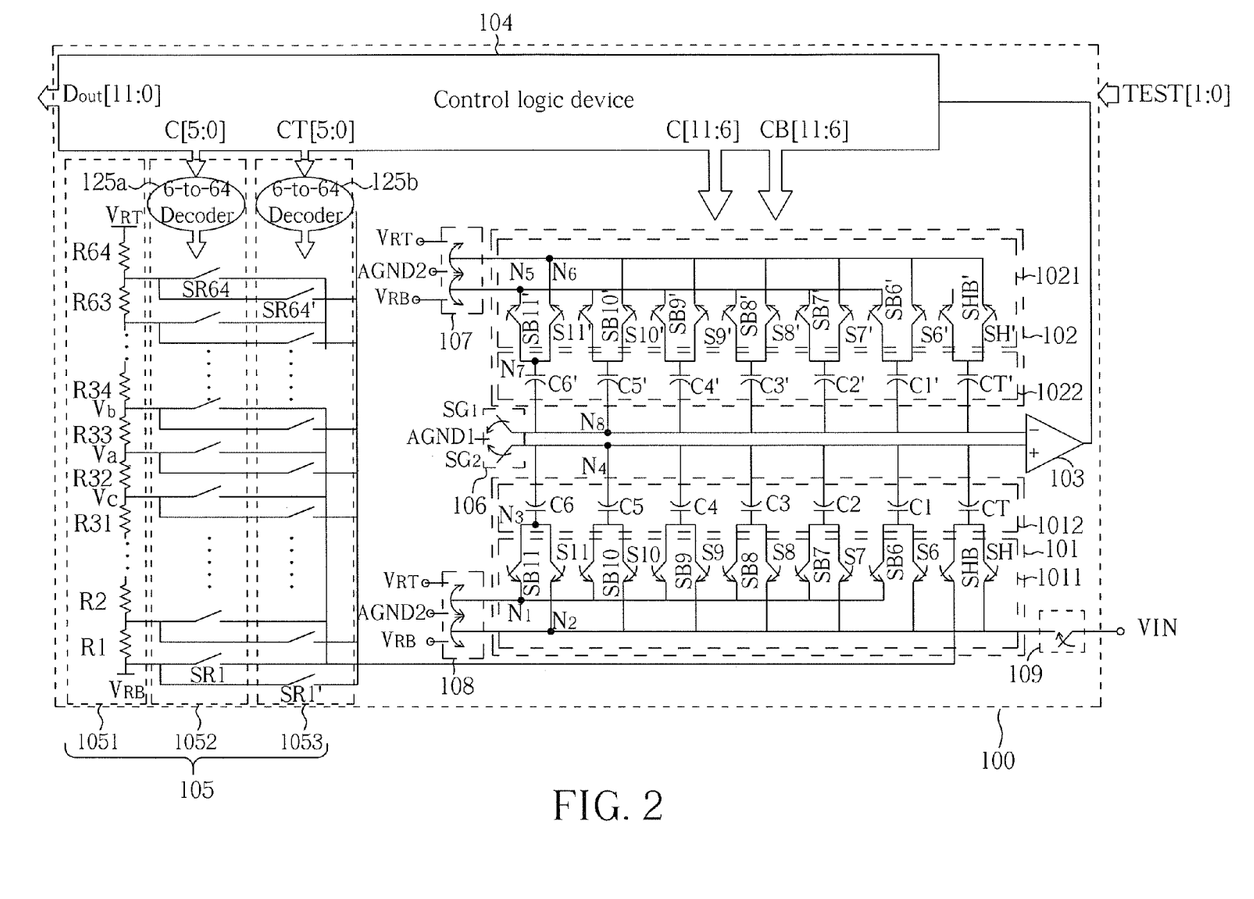
FIG. 2 is a diagram illustrating the signal converting apparatus with built-in self test according to an embodiment of the present invention.

Please refer to FIG. 2. FIG. 2 is a diagram illustrating an exemplary implementation of the signal converting apparatus 100 with built-in self test shown in FIG. 1. The first signal converting circuit 101 includes a first set of switching devices 1011 having a first terminal $N_1$ coupled to a first reference voltage $V_{RT}$ or AGND2 when operates under a self test mode, and having a second terminal $N_2$ coupled to a second reference voltage $V_{RB}$ or AGND2 when operates under the self test mode. Furthermore, the first set of switching devices 1011 has a plurality of first switching elements S6-S11, SB6-SB11, SH, SHB; and the first signal converting circuit 101 further comprises a first set of capacitor devices 1012. Taking a capacitor C6 included in the first set of capacitor devices 1012 for example, a first terminal $N_3$ is coupled to the first set of switching devices 1011, and a second terminal $N_4$ is selectively coupled to a third reference voltage AGND1. The first set of capacitor devices 1012 includes a plurality of first capacitors C1-C6 and a first terminal capacitor CT, and one end of each of the first capacitors C1-C5, similar to the first terminal N3 of the capacitor C6, is coupled to the first switching elements S6-S11, SB6-SB11, respectively. The first switching elements S6-S11, SB6-SB11 are configured to control the corresponding first capacitors C1-C6 respectively, to couple the first reference voltage $V_{RT}$, the second reference voltage $V_{RB}$, or AGND2; in addition, the first terminal capacitor CT is coupled to the first switching elements SH, SHB. The second signal converting circuit 102 comprises a second set of switching devices 1021 having a first terminal $N_5$ coupled to the first reference voltage $V_{RT}$ or VGND2 under a sampling phase of the self test mode, and having a second terminal $N_6$ coupled to the second reference voltage $V_{RB}$ or AGND2 under the sampling phase of the self test mode. Furthermore, the second set of switching devices 1021 includes a plurality of second switching elements S6'-S11', SB6'-SB11', SH', SHB'; and the second signal converting circuit 102 further comprises a second set of capacitor devices 1022 having a first terminal $N_7$ coupled to the second set of switching devices 1021, and having a second terminal $N_8$ selectively coupled to the third reference voltage AGND1. In addition, the second set of capacitor devices 1022 includes a plurality of second capacitors C1'-C6' and a second terminal capacitor CT', and the second capacitors C1'-C6' are coupled to the second switching elements S6'-S11', SB6'~SB11', respectively. The second switching elements S6'-S11', SB6'~SB11' are configured to control the corresponding second capacitors C1'-C6' respectively, to couple to the first reference voltage $V_{RT}$, the second reference voltage $V_{RB}$, or AGND2; in addition, the second terminal capacitor CT' is coupled to the second switching elements SH', SHB'.

A positive (+) input terminal and a negative (−) input terminal of the comparing device 103 are coupled to the first and the second signal converting circuits 101, 102 respectively, for comparing an output at the second terminal $N_4$ of the first set of capacitor devices 1012 and an output at the second terminal $N_8$ of the second set of capacitor devices 1022 under a bit-cycling phase of the self test mode to thereby generate a comparing result $D_{out}$[11:0]. The control logic device 104 is coupled to the comparing device 103 for generating a set of switching control signals C[5:0], CT[5:0], C[11:6], CB[11:6], wherein the switching control signals CB[11:6] are an inverse version of the counterpart switching control signals C[11:6]. The switching control signals C[11:6], CB[11:6], C[5:0], CT[5:0] are used to control first and second switching elements S6-S11, SB6-SB11, S6'-S11', SB6'-SB11' and the voltage dividing device 105.

The voltage dividing device 105 includes a voltage divider 1051 coupled between the first and the second reference voltages $V_{RT}$ and $V_{RB}$ for providing a plurality of voltage levels (please note that the voltage divider 1051 of this embodiment is implemented using 64 serially-connected resistors R1-R64); a third set of switching devices 1052 including a plurality of third switching elements SR1-SR64 and coupled between the voltage divider 1051 and the first terminal capacitor CT for selecting one of the voltage levels and coupling a selected output voltage level to the first terminal capacitor CT under the bit-cycling phase of the self test mode; a fourth set of switching devices 1053 including a plurality of fourth switching elements SR1'-SR64' and coupled between the voltage divider 1051 and the second terminal capacitor CT' for selecting one of the voltage levels and coupling a selected output voltage level to the second terminal capacitor CT' under the bit-cycling phase of the self test mode; and a fifth set of switching devices 106 coupled to the third reference voltage AGND1, the second terminal $N_4$ of the first set of capacitor devices 1012, and the second terminal $N_8$ of the second set of capacitor devices 1022, wherein the fifth set of switching devices 106 includes a plurality of fifth switching elements implemented for controlling whether the second terminal $N_4$ of the first set of capacitor devices 1012 and the second terminal $N_8$ of the second set of capacitor devices 1022 are coupled to the third reference voltage AGND1.

According to the embodiment of the present invention, the control logic device 104 outputs switching control signals C[11:6], CB[11:6], C[5:0], CT[5:0] to control the on/off status of switching elements included in the first, the second, the third, and the fourth sets of switching devices 1011, 1021, 1052, 1053 respectively, for determining if an error between the first set of capacitor devices 1012 and the second set of capacitor devices 1022 conforms to a predetermined requirement according to a plurality of comparing results. It should be noted that the switching control signals C[5:0] and CT[5:0] select and turn on a switching element via two 6-to-64 decoders 125a, 125b respectively. Additionally, the control logic device 104 further controls fifth switching elements included in the fifth set of switching devices 106. Moreover, the signal converting apparatus 100 with built-in self test further includes a plurality of switching elements 107-109 and the related connection configuration thereof is shown in FIG. 1 and FIG. 2.

The signal converting apparatus 100 of the present invention enters a normal mode in response to a set of mode switching control signals TEST[1:0]=00. Because operation of the signal converting apparatus under the normal mode is well known to those skilled in the pertinent art, a brief description is given as follows for simplicity. The normal mode operation includes a process of a sampling phase and a process of a bit-cycling phase. Referring to FIG. 2, the switching element 109 under a sampling phase of the normal mode couples the analog input VIN to the second terminal $N_2$ of the first set of switching devices 1011, and the switching device 108 is floating (i.e., the switching device 108 is not coupled to $V_{RT}$, $V_{RB}$, or AGND2). The first switching elements S6-S11, SB6-SB11 of the first set of switching devices 1011 couple the first capacitors C1-C6 to the second terminal $N_2$, while the first terminal capacitor CT of the first set of capacitor devices 1012 is coupled to the second terminal $N_2$ via the switching elements SH, SHB; additionally, the switching element 107 couples both the first and second terminals $N_5$ and $N_6$ of the second set of switching devices 1021 to AGND2, and the switching elements S6'-S11', SB6'-SB11' of the second set of switching devices 1021 couple the second capacitors C1'-C6' to the second terminal $N_6$. Furthermore, the other ends of the first and second sets of the capacitor devices 1012, 1022 are coupled to AGND1 via the fifth switching element 106. In this way, the operation of sampling the analog input VIN is completed.

Next, the signal converting apparatus 100 enters the bit-cycling phase of the normal mode. In this exemplary embodiment, the bit-cycling phase includes 12 bit cycles. During the $1^{st}$-$6^{th}$ bit cycles of the bitocycling phase, the switching element 108 couples the first terminal $N_1$ and the second terminal $N_2$ to the first reference voltage $V_{RT}$ and the second reference voltage $V_{RB}$ respectively, and the first switching elements SH and SHB couple the first terminal capacitor CT to an output of the third set of switching devices 1052. At this moment, the first terminal capacitor CT is coupled to the second reference voltage $V_{RB}$ due to a third switching element SR1 in the third set of switching devices 1052. In addition, the switching element 107 remains coupled to AGND2. The decoding of MSBs (i.e., $D_{out}[11:6]$) is accomplished through using the switching control signals C[11:6] and CB[11:6] to control on/off status of the first switching elements S6-S11, SB6-SB11, and then using the comparing device 103 to compare voltage levels at second terminals $N_4$ and $N_8$. During the $7^{th}$-$12^{th}$ bit cycles of the bit-cycling phase, the on/off status of the third switching elements SR1-SR64 are controlled by the switching control signals C[5:0] instead, and then a voltage level is coupled to one end of the first terminal capacitor CT in the first set of capacitor devices 1012. The decoding of LSBs (i.e., $D_{out}[5:0]$) is accomplished through using the comparing device 103 to compare voltage levels at second terminals $N_4$ and $N_8$. In the end, the control logic device 104 outputs $D_{out}[11:0]$ to complete the analog-to-digital conversion under the normal mode.

After the operation under the normal mode has been briefly described in above paragraphs, the operation under the self test mode of the present invention is detailed now.

Due to the control signal TEST [1:0]=01, the signal converting apparatus 100 is controlled to enter a first self test mode for performing a mutual test between one capacitor array and the other capacitor array. The operation under the self test mode also includes a process of a sampling phase and a process of a bit-cycling phase. Please refer to FIG. 3, which is a diagram illustrating the signal converting apparatus 100 operating under the sampling phase of the self test mode. When the signal converting apparatus 100 operates under the sampling phase of the self test mode, the control logic device 104 outputs a set of switching control signals $SG_1$ and $SG_2$ for controlling the fifth switching element 106 to couple the second terminal $N_4$ of the first set of capacitor devices 1012 and the second terminal $N_8$ of the second set of capacitor devices 1022 to the third reference voltage AGND1. Therefore, the control logic device 104 under the self test mode outputs the set of switching control signals from C[11:6]= 000001 to C[11:6]=111111 in sequence, in order to self-test all of the possible bit combinations, wherein the switching control signals C[11:6] control on/off status of the first switching elements S6-S11, SB6-SB11 and on/off status of the second switching elements S6'-S11', SB6'-SB11' that correspond to the first switching elements S6-S11, SB6-SB11, thereby coupling the first reference voltage $V_{RT}$ or the second reference voltage $V_{RB}$ to the first capacitors C1-C6 and the second capacitors C1'-C6' corresponding to the first capacitors C1-C6. Furthermore, every time the signal converting apparatus 100 enters the sampling phase, the control logic device 104 controls the first switching elements SH, SHB to couple the first terminal capacitor CT to the second terminal $N_2$ of the first set of switching devices 1011; similarly, the control logic device 104 also controls the second switching elements SH', SHB' to couple the second terminal capacitor CT' to the second terminal $N_6$ of the second set of switching devices 1021. Therefore, every time the signal converting apparatus 100 enters the sampling phase, the control logic device 104 sets the switching control signals C[11:6] and CB[11:6] to make the first and second sets of switching devices 1021 and 1011 coupled to the first reference voltage $V_{RT}$ or the second reference voltage $V_{RB}$.

According to the embodiment of the present invention, when the process in the sampling phase of the self test mode completes testing 6 most significant bits, the signal converting apparatus 100 will enter the bit-cycling phase. Please refer to FIG. 4, which is a diagram illustrating the signal converting apparatus 100 operating under the bit-cycling phase of the self test mode. Under the bit-cycling phase, the control logic device 104 outputs the set of switching control signals $SG_1$ and $SG_2$ for controlling the fifth switching element 106 to not couple the third reference voltage AGND1 to the second terminal $N_4$ of the first set of capacitor devices 1012 and the second terminal $N_8$ of the second set of capacitor devices 1022. Other terminals $N_1$, $N_2$, $N_5$ and $N_6$, however, are all coupled to AGND2. The control logic device 104 further controls the first switching elements SH, SHB to make the first terminal capacitor CT coupled to an output voltage level selected by the third set of switching devices 1052; similarly, the control logic device 104 simultaneously controls the second switching elements SH', SHB' to make the second terminal capacitor CT' coupled to an output voltage level selected by the fourth set of switching devices 1053. When the signal converting apparatus 100 operates under the first bit cycle of the bit-cycling phase, the control logic device 104 outputs the set of switching control signals C[5:0] and CT[5:0] for controlling the third switching elements SR1-SR64 and fourth switching elements SR1'-SR64' to couple a first voltage level Va and a second voltage level Vb to the second terminal capacitor CT' and the first terminal capacitor CT, respectively. When the signal converting apparatus 100 operates under the second bit cycle of the bit-cycling phase, the control logic device 104 outputs the set of switching control signals C[5:0] and CT[5:0] for controlling the third switching elements SR1-SR64 and other fourth switching elements SR1'-SR64' to couple the first voltage level Va and a third voltage level Vc to the second terminal capacitor CT' and the first terminal capacitor CT, respectively. Then, if the comparing results of the comparing device 103 that are generated under the first bit cycle and the second bit cycle of the bit-cycling phase indicate that $D_{out}[1:0]$ is not 10, the control logic device 104 determines that the error between the first set of capacitor devices 1012 and the second set of capacitor devices 1022 does not meet the predetermined requirement. Please note that the first voltage level Va and the second voltage level Vb are two adjacent voltage levels that are generated by the voltage divider 1051, the first voltage level Va and the third voltage level Vc are also two adjacent voltage levels that are generated by the voltage divider 1051, and the difference between the first voltage level Va and the second voltage level Vb is equal to the difference between the first voltage level Va and the third voltage level Vc. The first, second, and third reference voltages Va, Vb, Vc determine tuning amount of the voltage dividing circuit that is applied to the first terminal capacitor CT and the second terminal capacitor CT' under the self test mode. Suppose that the first reference voltage Va is an initial common voltage set after the sampling phase but before the bit-cycling phase. During the first bit cycle of the bit-cycling phase, the switching control signals C[5:0] control the first terminal capacitor CT to couple the second reference voltage Vb, while the switching control signals CT[5:0] remain invariant to thereby keep the second terminal capacitor CT' coupled to the first reference voltage Va. During the second bit cycle of the bit-cycling phase, the switching control signals C[5:0] control the first terminal capacitor CT to couple the third reference voltage Vc, while the switching control signals CT[5:0] still remain invariant to thereby keep the second terminal capacitor CT' coupled to the first reference voltage Va. In this way, the switching operations under two bit cycles of the bit-cycling phase are completed. It should be noted that the difference between the reference voltages can be adjusted through properly setting the switching control signals C[5:0] to control voltage levels of the second reference voltage Vb and the third reference voltage Vc according to desired precision test specification.

In order to describe the spirit of the present invention more clearly, the following paragraph takes an n-bit analog-to-digital converter as an example, where the capacitor devices determine m bits corresponding to MSBs, while the voltage dividing device determines (n–m) bits corresponding to LSBs. Due to the fact that the capacitor devices determine MSBs, the total number of capacitor units is equal to $2^m$. Under the sampling phase of the self test mode, the switching control signals (e.g., C[11:6] and CB[11:6] of above exemplary embodiment) control that each of L capacitor units has two ends coupled to the first reference voltage $V_{RT}$ and the third reference voltage VGND1, each of K capacitor units has two ends coupled to the second reference voltage $V_{RB}$ and the third reference voltage VGND1, and a terminal capacitor unit (e.g., the first terminal capacitor CT and the second terminal capacitor CT' of above exemplary embodiment) has two ends coupled to the second reference voltage $V_{RB}$ and the third reference voltage AGND1. The relationship of $2^m$, L, and K can be described by the following equation:

$$2^m = L + K + 1 \quad (1)$$

The capacitance of the capacitor units might be different due to process variation. Suppose that the capacitance values of the first and second terminal capacitors CT and CT' are $C_{TP}$ and $C_{TN}$ respectively, and L capacitor units, each coupled between the first reference voltage $V_{RT}$ and the third reference voltage AGND1 and included in the first set of capacitor devices, have a total capacitance amount equal to $CL_P$. Therefore, the relative error between $C_{TP}$ and $CL_P$ can be represented by following equation.

$$\Delta P_1 = \frac{CL_P}{C_{TP}} - L \quad (2)$$

Similarly, provided that K capacitor units, each coupled between the second reference voltage $V_{RB}$ and the third reference voltage AGND1, have a total capacitance amount equal to $CK_P$, the relative error between $C_{TP}$ and $CK_P$ can be represented by following equation:

$$\Delta P_2 = \frac{CK_P}{C_{TP}} - K \quad (3)$$

Regarding errors of the second set of capacitor devices, the following equations can be easily derived according to above equations (2) and (3).

$$\Delta N_1 = \frac{CL_N}{C_{TN}} - L \quad (4)$$

$$\Delta N_2 = \frac{CK_N}{C_{TN}} - K \quad (5)$$

During the sampling phase of the self test mode, the total electric charge amounts $Q_P$ and $Q_N$ in the first set of capacitor devices 1012 and the second set of capacitor devices 1022 can be represented using equations listed below. Please note that the voltage level Vp at the second terminal $N_4$ of the first set of capacitor devices 1012 and the voltage level Vn at the second terminal $N_8$ of the second set of capacitor devices 1022 are both AGND1, i.e., Vn=Vp=AGND1.

$$Qp = (L + \Delta P_1) \times C_{TP} \times (AGND1 - V_{RT}) + (K + \Delta P_2) \times C_{TP} \times (AGND1 - V_{RB}) + C_{TP} \times (AGND1 - V_{RB}) \quad (6)$$

$$Qn = (L + \Delta N_1) \times C_{TN} \times (AGND1 - V_{RT}) + (K + \Delta N_1) \times C_{CN} \times (AGND1 - V_{RB}) + C_{TN} \times (AGND1 - V_{RB}) \quad (7)$$

After the process of the sampling phase is accomplished, the first bit cycle of the bit-cycling phase is started. At this moment, the switching control signals $SG_1$ and $SG_2$ control the fifth switching element 106 to disconnect the third reference voltage AGND1 from the second terminals $N_4$ and $N_8$. The other end of the first terminal capacitor CT of the first set of capacitor devices 1012 is coupled to AGND3+$V_{RLSB}$, where $V_{RLSB}$ represents a voltage difference between two adjacent voltage levels provided by the resistor string, and is equal to $$\frac{V_{RT} - V_{RB}}{2^{(n-m)}}$$

In addition, the other end of each remaining capacitor is coupled to a common voltage AGND2. In addition, the other end of the second terminal capacitor CT' of the second set of capacitor devices 1022 is coupled to AGND3, and the other end of each remaining capacitor is coupled to the common voltage AGND2. After the process of the first bit cycle of the bit-cycling phase is accomplished, the voltage levels at second terminals $N_4$ and $N_8$ are Vn' and Vp' respectively, and the total electric charge amounts $Q_P{'}$ and $Q_N{'}$ in the first set of capacitor devices 1012 and the second set of capacitor devices 1022 can be represented by following equations.

$$Qp' = (L+\Delta P_1+K+\Delta P_2) \times C_{TP} \times (Vp'-AGND2) + C_{TP} \times (Vp'-(AGND3+V_{RLSB})) \tag{8}$$

$$Qn' = (L+\Delta N_1+K+\Delta N_2) \times C_{TN} \times (Vn'-AGND2) + C_{TN} \times (Vn'-AGND3) \tag{9}$$

Due to charge conservation law, $Q_P'=Q_P$ and $Q_N'=Q_N$. Therefore, the values of Vn' and Vp' can be derived through following computation, in which AGND2 and AGND3 could be $$\frac{V_{RT} - V_{RB}}{2}.$$

$$Qp' = Qp \Rightarrow \tag{10}$$

$$(L + \Delta P_1 + K + \Delta P_2) \times C_{TP} \times (Vp' - AGND2) + \tag{11}$$
$$C_{TP} \times (Vp' - (AGND3 + V_{RLSB})) =$$
$$(L + \Delta P_1) \times C_{TP} \times (AGND1 - V_{RT}) +$$
$$(K + \Delta P_2) \times C_{TP} \times (AGND1 - V_{RB}) + C_{TP} \times (AGND1 - V_{RB}) \Rightarrow$$

$$V_{RT} \times (L + \Delta P_1) + V_{RB} \times (K + \Delta P_2 + 1) + \tag{12}$$

$$Vp' = AGND1 + AGND2 - \frac{AGND2 - \left(\frac{V_{RT} - V_{RB}}{2} + V_{RLSB}\right)}{L + \Delta P_1 + K + \Delta P_2 + 1}$$

$$= AGND1 + AGND2 - V_{RB} -$$
$$\frac{(L + \Delta P_1) \times (V_{RT} - V_{RB})}{L + \Delta P_1 + K + \Delta P_2 + 1} + \frac{V_{RLSB}}{L + \Delta P_1 + K + \Delta P_2 + 1}$$

$$Qn' = Qn \Rightarrow \tag{13}$$

$$(L + \Delta N_1 + K + \Delta N_2) \times C_{TN} \times (Vn' - AGND2) + \tag{14}$$
$$C_{TN} \times (Vn' - AGND3) = (L + \Delta N_1) \times C_{TN} \times (AGND1 - V_{RT}) +$$
$$(K + \Delta N_2) \times C_{TN} \times (AGND1 - V_{RB}) + C_{TN} \times (AGND1 - V_{RB}) \Rightarrow$$

$$V_{RT} \times (L + \Delta N_1) + V_{RB} \times (K + \Delta N_2 + 1) + \tag{15}$$

$$Vn' = AGND1 + AGND2 - \frac{AGND2 - \frac{V_{RT} - V_{RB}}{2}}{L + \Delta N_1 + K + \Delta N_2 + 1}$$

$$= AGND1 + AGND2 - V_{RB} - \frac{(L + \Delta N_1) \times (V_{RT} - V_{RB})}{L + \Delta N_1 + K + \Delta N_2 + 1}$$

Next, $V_P'$ is compared with $V_N'$. When Vp'−Vn'>0, the following inequalities can be derived:

$$-\frac{(L + \Delta P_1) \times (V_{RT} - V_{RB})}{L + \Delta P_1 + K + \Delta P_2 + 1} + \tag{16}$$
$$\frac{(L + \Delta N_1) \times (V_{RT} - V_{RB})}{L + \Delta N_1 + K + \Delta N_2 + 1} + \frac{V_{RLSB}}{L + \Delta P_1 + K + \Delta P_2 + 1} > 0$$

$$\Rightarrow \frac{(L + \Delta P_1) \times (V_{RT} - V_{RB})}{L + \Delta P_1 + K + \Delta P_2 + 1} - \frac{(L + \Delta N_1) \times (V_{RT} - V_{RB})}{L + \Delta N_1 + K + \Delta N_2 + 1} < \tag{17}$$
$$\frac{V_{RLSB}}{L + \Delta P_1 + K + \Delta P_2 + 1}$$

After substituting $$V_{RLSB} = \frac{V_{RT} - V_{RB}}{2^{(n-m)}(1 + \varepsilon_R)}$$

into above equation (17), equation (17) can be re-formulated to derive the final result of the first bit cycle of the bit-cycling phase. It should be noted that $\varepsilon_R$ represents an error of the voltage dividing device, and $L+K+1=2^m$. The re-formulated inequality is as follows:

$$\frac{(L + \Delta P_1)}{2^m + \Delta P_1 + \Delta P_2} - \frac{(L + \Delta N_1)}{2^m + \Delta N_1 + \Delta N_2} < \tag{18}$$

$$\frac{1}{2^{(n-m)}(1 + \varepsilon_R)} \times \frac{1}{2^m + \Delta P_1 + \Delta P_2}$$

After the first bit cycle of the bit-cycling phase is accomplished, the second bit cycle of the bit-cycling phase is started. During the second bit cycle, the connection configuration of the second set of capacitor devices 1022 remains the same; however, the first terminal capacitor CT with capacitance value $C_{TP}$ is coupled to AGND3−$V_{RLSB}$ instead of AGND3+$V_{RLSB}$. The total electric charge amount $Q_P''$ in the first set of capacitor devices 1012 can be represented by the equations listed below. Please note that the voltage levels at second terminals $N_4$ and $N_8$ are Vp'' and Vn'' now, and AGND2 and AGND3 are set to $$\frac{V_{RT} - V_{RB}}{2}$$

presented in the first bit cycle of the bit-cycling phase.

$$Qp'' = (L+\Delta P_1+K+\Delta P_2) \times C_{TP} \times (Vp''-AGND2) + C_{TP} \times (Vp''-(AGND3-V_{RLSB})) \tag{19}$$

Due to charge conservation law, $Q_P''=Q_P'=Q_P$. Therefore, the value of Vp'' can be derived through following computation.

$$(L + \Delta P_1 + K + \Delta P_2) \times C_{TP} \times (Vp'' - AGND2) + \tag{20}$$
$$C_{TP} \times (Vp'' - (AGND3 - V_{RLSB})) =$$
$$(L + \Delta P_1) \times C_{TP} \times (AGND1 - V_{RT}) +$$
$$(K + \Delta P_2) \times C_{TP} \times (AGND1 - V_{RB}) + C_{TP} \times (AGND1 - V_{RB}) \Rightarrow$$

$$V_{RT} \times (L + \Delta P_1) + V_{RB} \times (K + \Delta P_2 + 1) + \tag{21}$$

$$Vp'' = AGND1 + AGND2 - \frac{AGND2 - (AGND3 - V_{RLSB})}{L + \Delta P_1 + K + \Delta P_2 + 1}$$

$$= AGND1 + AGND2 - V_{RB} - \frac{(L + \Delta P_1) \times (V_{RT} - V_{RB})}{L + \Delta P_1 + K + \Delta P_2 + 1} -$$
$$\frac{V_{RLSB}}{L + \Delta P_1 + K + \Delta P_2 + 1}$$

As mentioned above, the connection configuration of the second set of capacitor devices 1022 remains the same, which implies that Vn''=Vn'. Therefore, after the computation result of Vp'' is substituted into the inequality Vp''−Vn''<0, the following inequality is derived accordingly:

$$\frac{(L + \Delta N_1) \times (V_{RT} - V_{RB})}{L + \Delta N_1 + K + \Delta N_2 + 1} - \frac{(L + \Delta P_1) \times (V_{RT} - V_{RB})}{L + \Delta P_1 + K + \Delta P_2 + 1} < \tag{22}$$

$$\frac{V_{RLSB}}{L + \Delta P_1 + K + \Delta P_2 + 1}$$

Additionally, after substituting $$V_{RLSB} = \frac{V_{RT} - V_{RB}}{2^{(n-m)}(1 + \varepsilon_R)}$$

into above inequality (22), inequality (22) can be re-formulated as below. It should be noted that $\varepsilon_R$ represents an error of the voltage dividing device, and $L+K+1=2^m$.

$$\frac{(L + \Delta P_1)}{2^m + \Delta P_1 + \Delta P_2} - \frac{(L + \Delta N_1)}{2^m + \Delta N_1 + \Delta N_2} > \qquad (23)$$
$$-\frac{1}{2^{(n-m)}(1 + \varepsilon_R)} \times \frac{1}{2^m + \Delta P_1 + \Delta P_2}$$

In conclusion, using the inequality $V_p'-V_n'>0$ for the first bit cycle of the bit-cycling phase and the inequality $V_p''-V_n''<0$ for the second bit cycle of the bit-cycling phase, two inequalities (18) and (23) mentioned above are finally obtained. For clarity, both of the inequalities (18) and (23) are listed again, as below:

$$\frac{(L + \Delta P_1)}{2^m + \Delta P_1 + \Delta P_2} - \frac{(L + \Delta N_1)}{2^m + \Delta N_1 + \Delta N_2} < \frac{1}{2^{(n-m)}(1 + \varepsilon_R)} \times \frac{1}{2^m + \Delta P_1 + \Delta P_2}$$

$$\frac{(L + \Delta P_1)}{2^m + \Delta P_1 + \Delta P_2} - \frac{(L + \Delta N_1)}{2^m + \Delta N_1 + \Delta N_2} > -\frac{1}{2^{(n-m)}(1 + \varepsilon_R)} \times \frac{1}{2^m + \Delta P_1 + \Delta P_2}$$

In an n-bit analog-to-digital converter, a capacitor network is implemented to determine m bits corresponding to MSBs. To meet the requirement of $-1LSB<INL<1LSB$, the relative error within the capacitor network and error caused by the peripheral circuits must be less than $$\frac{1}{2^n}.$$

That is, for each value of L (L=1~63), the error must meet the requirements $$\frac{L + \Delta P_1}{2^m + \Delta P_1 + \Delta P_2} - \frac{L}{2^m} < \frac{1}{2^n}$$

and $$\frac{L + \Delta P_1}{2^m + \Delta P_1 + \Delta P_2} - \frac{L}{2^m} > -\frac{1}{2^n}.$$

As one can see, the second term presented in the left side of the inequality should be $$\frac{L}{2^m},$$

ideally; however, this term in the present invention is actually realized by $$\frac{L + \Delta N_1}{2^m + \Delta N_1 + \Delta N_2},$$

which is more strict than the ideal value $$\frac{L}{2^m}$$

and might result in a greater error after the second term is subtracted from the first term in the left side of the inequality. Please note that when implemented on the chip, the first set of capacitor devices and the second set of capacitor devices are prevented from having identical tendency to errors, thereby making the detected error smaller than the actual one. This can be easily realized by placement and layout techniques employed in the physical design of the first and second sets of capacitor devices. In addition, the single term in the right side of the inequality should be $$\frac{1}{2^n},$$

ideally; however, this term in the present invention is actually realized by $$\frac{1}{2^{(n-m)}(1 + \varepsilon_R)} \times \frac{1}{2^m + \Delta P_1 + \Delta P_2},$$

which can be re-formulated as below:

$$\frac{1}{2^{(n-m)}(1 + \varepsilon_R)} \times \frac{1}{2^m + \Delta P_1 + \Delta P_2} = \qquad (24)$$
$$\frac{1}{2^{(n-m)}(1 + \varepsilon_R)} \times \frac{1}{2^m \left(1 + \frac{\Delta P_1}{2^m} + \frac{\Delta P_2}{2^m}\right)} =$$
$$\frac{1}{2^n} \times \frac{1}{(1 + \varepsilon_R) \times \left(1 + \frac{\Delta P_1}{2^m} + \frac{\Delta P_2}{2^m}\right)}$$

Because of the advance of semiconductor process technique, a conservative estimate of $\varepsilon_R$ is less than ±4%. Additionally, in a case where $\Delta P_1, \Delta P_2 \leq \pm 1\%$ and $m \geq 3$, the error between the ideal value and the single term present in the right side of the inequality approximates to $\varepsilon_R$ ($\varepsilon_R \leq \pm 4\%$). The detection precision of the first self test mode is assumed to be $-1LSB<INL<1LSB$. The actual detection precision of the present invention, however, is $-0.096LSB<INL<1.004LSB$. Therefore, the present invention can achieve a very small detection error. Furthermore, the detection precision can be improved by adjusting the bit resolution of the resistor string. For example, when the resistor string has one-bit resolution increment (i.e., the difference between adjacent voltage levels provided by the resistor string is adjusted to $$\frac{1}{2^{(n-m+1)}}),$$

the detection precision is improved to $$\frac{1}{2} LSB.$$

Moreover, the precision under test can be determined by adjusting the voltage levels of the second and third reference voltages Vb and Vc mentioned above.

In a case where the inequalities $V_p'-V_n'>0$ and $V_p''-V_n''<0$ are both true, the comparator output corresponding to the first bit cycle of the bit-cycling phase is 1, and the comparator output corresponding to the second bit cycle of the bit-cycling phase is 0. As a result, $D_{out}[1:0]$ is 10 under the self test mode, which means that the relative error between the first and second sets of capacitor devices is within the configured precision range. Therefore, the detection procedure mentioned above is finished. For different values of L (L=1-63 and C[11:6]=000001-111111), the above self test procedure is repeated. In the end, the mutual test between capacitor arrays is completed.

Figure 3:
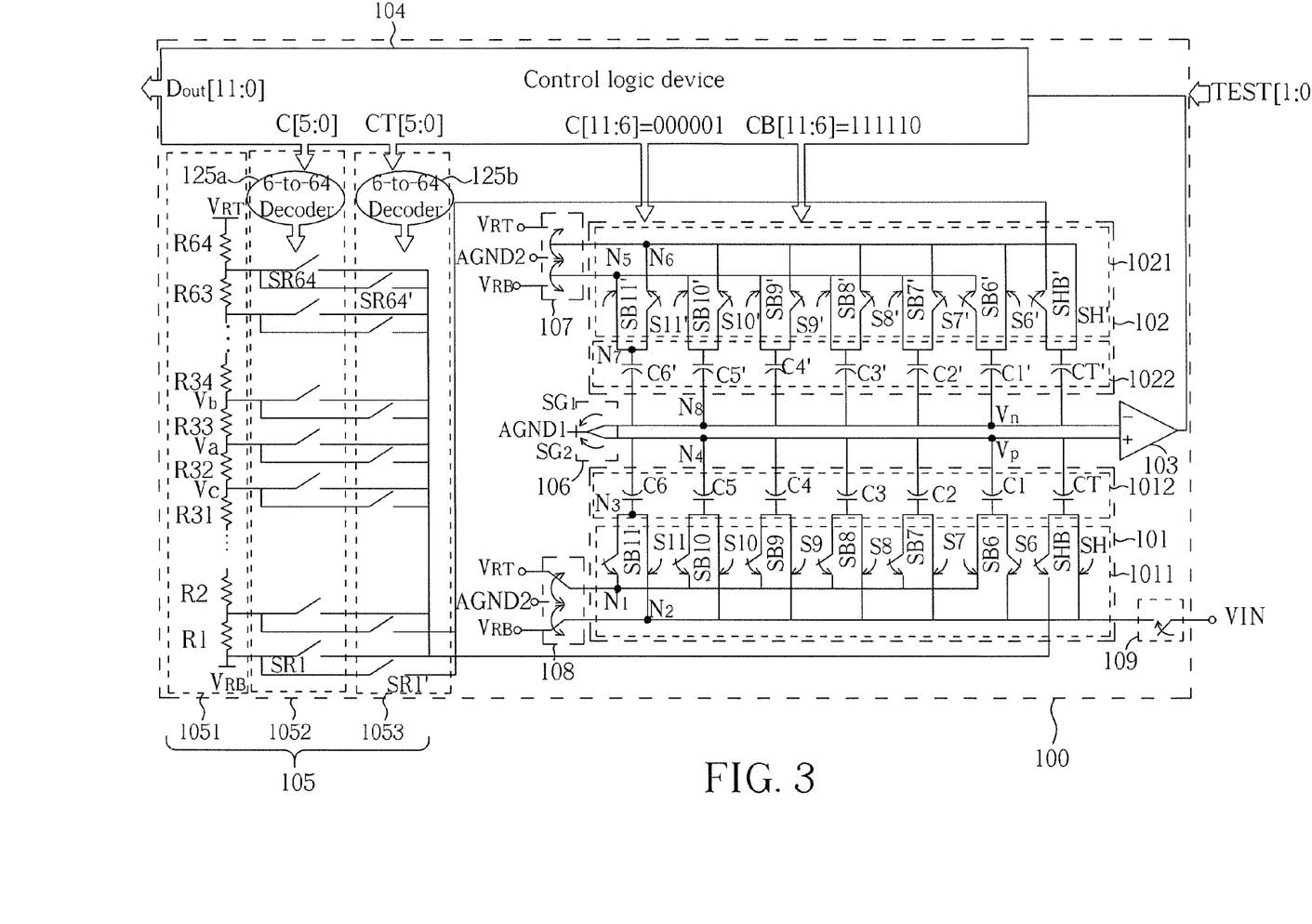
FIG. 3 is a diagram illustrating the signal converting apparatus when it operates under a sampling phase of a self test mode.

The operation directed to the mutual test between capacitor arrays has been detailed in above paragraphs. In the following, an example of testing the most significant bit, 000001, is given for illustrative purposes. According to the above-mentioned disclosure, when the signal converting apparatus 100 operates under the sampling phase of the self test mode, the control logic device 104 outputs the set of switching control signals C[11:6]=000001. Meanwhile, both of the first capacitor C1 and the second capacitor C1' are couple to the first reference voltage $V_{RT}$, and the remaining first capacitors C2-C6 and the second capacitors C2'-C6' are all coupled to the second reference voltage $V_{RB}$. The connection configuration of other switching devices is shown in FIG. 3. Accordingly, the total electric charge amounts Qp and Qn in the first set of capacitor devices 1012 and the second set of capacitor devices 1022 can be respectively described by the following equations:

$$Qp = (L+\Delta P_1) \times C_{TP} \times (AGND1 - V_{RT}) + (K+\Delta P_2) \times C_{TP} \times (AGND1 - V_{RB}) + C_{TP} \times (AGND1 - V_{RB}) \quad (25)$$

$$Qn = (L+\Delta N_1) \times C_{TN} \times (AGND1 - V_{RT}) + (K+\Delta N_2) \times C_{TN} \times (AGND1 - V_{RB}) + C_{TN} \times (AGND1 - V_{RB}) \quad (26)$$

Figure 4:
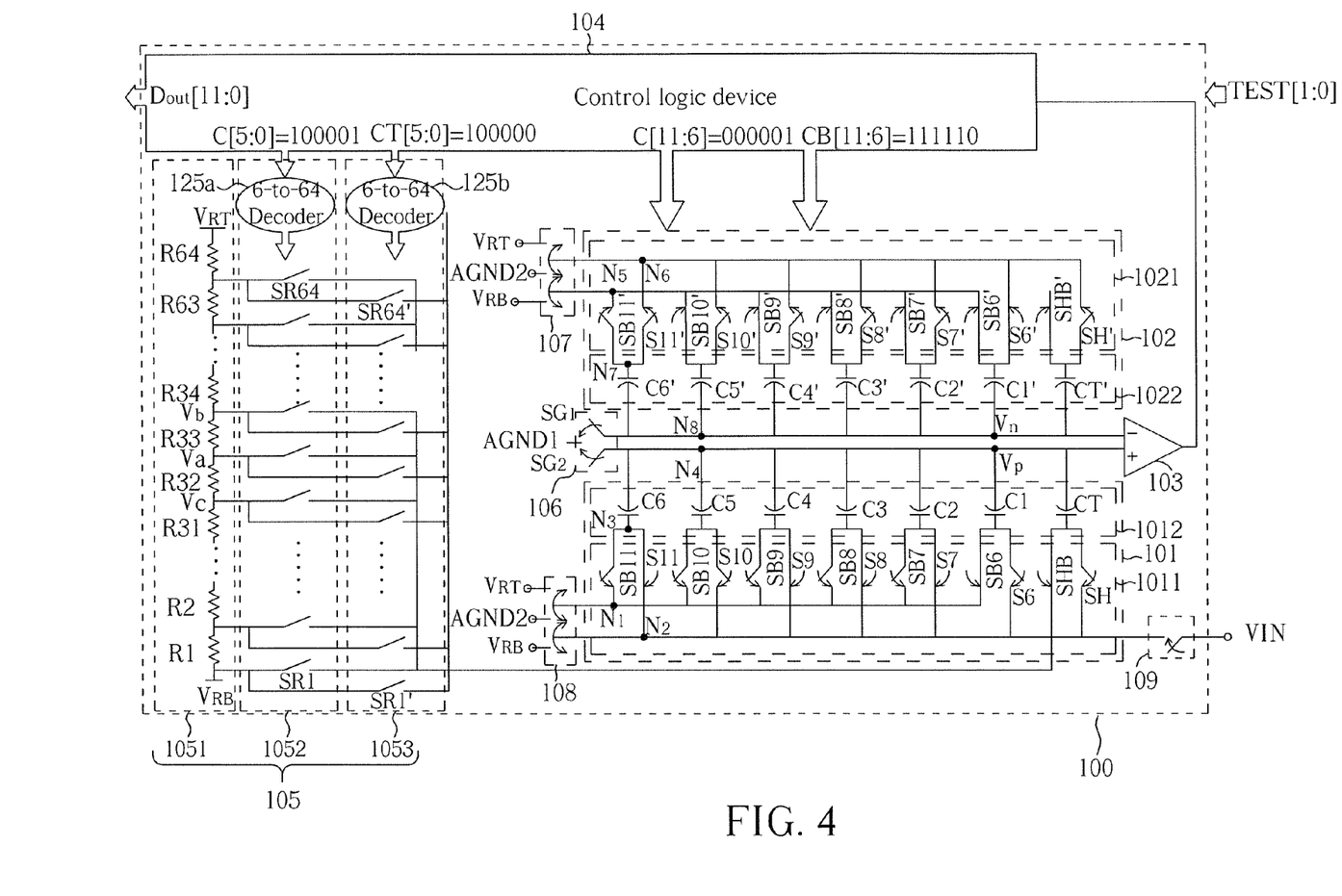
FIG. 4 is a diagram illustrating the signal converting apparatus when it operates under a first bit cycle of a bit-cycling phase of the self test mode.

In above equations (25) and (26), Vp and Vn represent the voltage levels at the positive (+) and negative (−) input terminals of the comparing device 103 respectively. As shown in FIG. 4, the fifth set of switching devices 106 is controlled to couple second terminals $N_4$ and $N_8$ to the third reference voltage AGND1. As a result, Vp=Vn=AGND1.

Then, the exemplary signal converting apparatus 100 of the present invention proceeds with the process of the bit-cycling phase. In the first bit cycle, the control logic device 104 keeps the set of switching control signals C[11:6] and CT[5:0] invariant, but switches the set of the switching control signals C[5:0] to 100001 and switches the set of the switching control signals CT[5:0] to 100000. The first terminal capacitor CT is coupled to the second voltage level Vb via the third set of switching devices 1052, and the second terminal capacitor CT' is coupled to the first voltage level Va via the fourth set of switching devices 1053. The magnitude of the first voltage level Va is $$\frac{V_{RT} - V_{RB}}{2},$$

and the magnitude of the second voltage level Vb is $$\frac{V_{RT} - V_{RB}}{2} + \frac{V_{RT} - V_{RB}}{64}.$$

The related connection configuration is shown in FIG. 4. Accordingly, the total electric charge amounts Qp and Qn in the first set of capacitor devices 1012 and the second set of capacitor devices 1022 can be respectively described by the following equations:

$$Qp' = (L+\Delta P_1 + K+\Delta P_2) \times C_{TP} \times (Vp' - AGND2) + C_{TP} \times (Vp' - (AGND3 + V_{RLSB})) \quad (27)$$

$$Qn' = (L+\Delta N_1 + K+\Delta N_2) \times C_{TN} \times (Vn' - AGND2) + C_{TN} \times (Vn' - AGND3) \quad (28)$$

In above equations (27) and (28), Vp' and Vn' represent the voltage levels at the positive (+) and negative (−) input terminals of the comparing device 103 under the first bit cycle. In addition, according to the charge conservation law, $Q_P' = Q_P$ and $Q_N' = Q_N$. Therefore, the values of Vp' and Vn' can be derived through computation, as below.

$$\begin{aligned} Vp' &= AGND1 + AGND2 - \frac{V_{RT} \times (L+\Delta P_1) + V_{RB} \times (K+\Delta P_2 + 1) + AGND2 - \left(\frac{V_{RT} - V_{RB}}{2} + V_{RLSB}\right)}{L+\Delta P_1 + K+\Delta P_2 + 1} \\ &= AGND1 + AGND2 - V_{RB} - \frac{(L+\Delta P_1) \times (V_{RT} - V_{RB})}{L+\Delta P_1 + K+\Delta P_2 + 1} + \frac{V_{RLSB}}{L+\Delta P_1 + K+\Delta P_2 + 1} \end{aligned} \quad (29)$$

$$\begin{aligned} Vn' &= \frac{V_{RT} \times (L+\Delta N_1) + V_{RB} \times (K+\Delta N_2 + 1) + AGND2 - \frac{V_{RT} - V_{RB}}{2}}{L+\Delta N_1 + K+\Delta N_2 + 1} \\ &= AGND1 + AGND2 - V_{RB} - \frac{(L+\Delta N_1) \times (V_{RT} - V_{RB})}{L+\Delta N_1 + K+\Delta N_2 + 1} \end{aligned} \quad (30)$$

If Vp'−Vn'>0, the comparing result of the comparing device 103 is 1; otherwise, the comparing result is 0.

Then, the exemplary signal converting apparatus 100 of the present invention proceeds with the process of the second bit cycle of the bit-cycling phase. In the second bit cycle, the control logic device 104 keeps the set of switching control signals C[11:6] and CT[5:0] invariant, but switches the set of the switching control signals C[5:0] from 100001 to 011111. Thus, the first terminal capacitor CT is coupled to the third voltage level Vc via the third set of switching devices 1052. Meanwhile, the magnitude of the third voltage level Vc is $$\frac{V_{RT} - V_{RB}}{2} - \frac{V_{RT} - V_{RB}}{64}.$$

As the set of switching control signals CT [5:0] is kept invariant, the first voltage level Va coupled to the second terminal capacitor CT is held at $$\frac{V_{RT} - V_{RB}}{2} + \frac{V_{RT} - V_{RB}}{64}.$$

Figure 5:
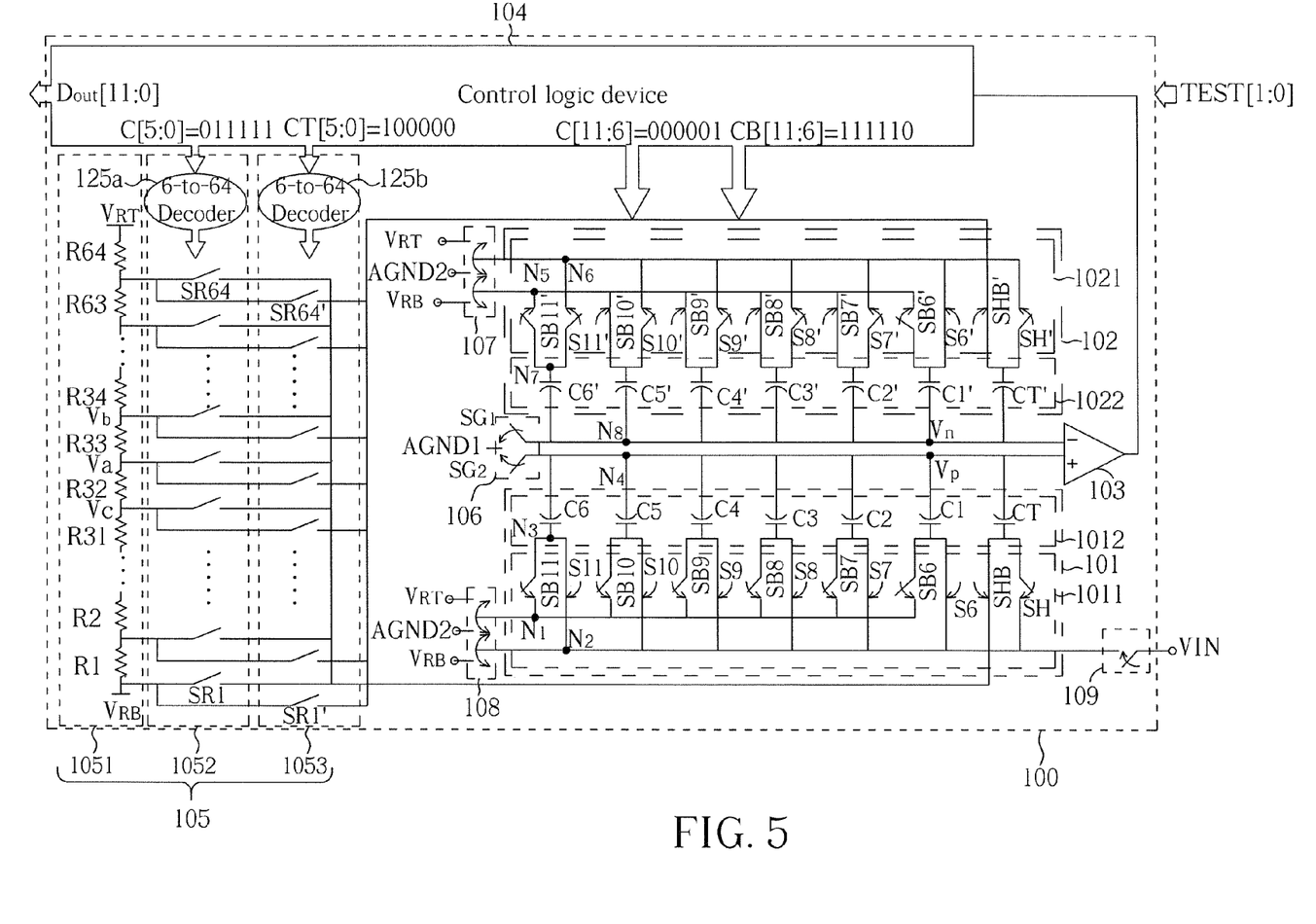
FIG. 5 is a diagram illustrating the signal converting apparatus when it operates under a second bit cycle of the bit-cycling phase.

The related connection configuration is shown in FIG. 5, which is a diagram illustrating the signal converting apparatus 100 operating under the second bit cycle of the bit-cycling phase. Therefore, the total electric charge amount Qp'' in the first set of capacitor devices 1012 can be described by the following equation:

$$Qp'' = (L+\Delta P_1 + K+\Delta P_2) \times CP \times (Vp'' - AGND2) + C_{TP} \times (Vp'' - (AGND3 - V_{RLSB})) \quad (31)$$

According to the charge conservation law, Qp''=Qp' and Qn''=Qn'. Thus, the value of Vp'' can be derived by computation, as below:

$$Vp'' = AGND1 + AGND2 - \frac{V_{RT} \times (L + \Delta P_1) + V_{RB} \times (K + \Delta P_2 + 1) + AGND2 - (AGND3 - V_{RLSB})}{L + \Delta P_1 + K + \Delta P_2 + 1} \quad (32)$$

$$= AGND1 + AGND2 - V_{RB} - \frac{(L + \Delta P_1) \times (V_{RT} - V_{RB})}{L + \Delta P_1 + K + \Delta P_2 + 1} - \frac{V_{RLSB}}{L + \Delta P_1 + K + \Delta P_2 + 1}$$

Because the switching control signals CT[5:0] are kept invariant during the second bit cycle of the bit-cycling phase, Vn″ is equal to Vn′. If Vp″−Vn″<0, the comparing result of the comparing device 103 is 0; otherwise, the comparing result is 1.

When the second bit cycle of the signal converting device 100 is accomplished and the comparing result $D_{out}[1:0]$ is 10, this represents that the error is less than one least significant bit and the mutual test between the first set of the capacitor devices 1012 and the second set of capacitor devices 1022 therefore meets the precision requirement under C[11:6]= 000001; on the contrary, when the comparing result $D_{out}[1:0]$ is not 10, this represents that the matching error of the capacitor arrays exceeds one least significant bit and the mutual test between the first set of the capacitor devices 1012 and the second set of capacitor devices 1022 fails to meet the precision requirement. Similarly, the above-disclosed method is utilized to mutually test the first set of capacitor devices 1012 and the second set of capacitor devices 1022 from the switching control signals C[11:6]=000010 to C[11:6]=111111 (i.e., the remaining most significant bits 000010-111111). Accordingly, if each of the comparing results $D_{out}$ that are tested from the switching control signals C[11:6]=000010 to C[11:6]= 111111 is 10, then error between the first set of capacitor devices 1012 and the second set of capacitor devices 1022 of the exemplary signal converting apparatus 100 meets the precision requirement of at least one least significant bit. In other words, the error of corresponding capacitors in the capacitor network is confirmed by the mutual test to achieve the 12-bit resolution requirement.

The tested precision setting can be controlled by the aforementioned switching control signals C[5:0]. That is, the capacitor error amount to be monitored can be adjusted by changing the difference between two adjacent voltage levels provided by the resistor string, i.e., $$\frac{1}{2^{(n-m)}}$$

mentioned above. In above exemplary embodiment, the tested precision is one least significant bit. Therefore, when the difference between two adjacent voltage levels provided by the resistor string is increased to $$\frac{1}{2^{(n-m-2)}},$$

the tested precision becomes 4LSB. This can be easily realized by using C[5:0]=100100 in the first bit cycle of the bit-cycling phase and using C[5:0]=011100 in the second bit cycle of the bit-cycling phase. In other words, the tested precision can be adjusted depending upon desired resolution requirement.

After the mutual test between the first set of capacitor devices 1012 and the second set of capacitor devices 1022 is completed, and the precision requirement for the first set of capacitor devices is met, the signal converting apparatus enters a second self test mode under the control of the control signal TEST[1:0]=10, and then uses the tested capacitor devices to test the voltage dividing device implemented using a resistor string for checking if the voltage dividing device under test can meet another resolution requirement. As the detailed description directed to operations under second self test mode can be found in many references, a brief description is given as follows for simplicity. Please refer to FIG. 2. The signal converting apparatus 100 enters the second self test mode to proceed with the mutual test between the first set of capacitor devices 1012 and the voltage dividing device 105 to thereby check if the integrated linearity error (INL) of the voltage dividing device 105 in the signal converting apparatus 100 meets the 6-bit resolution requirement. The test method comprises a sampling phase and a bit-cycling phase including six bit cycles. During the sampling phase of the second self test mode, Vn and Vp are coupled to AGND1 via a switching device. In addition, the control signals CT[5:0] control the third set of switching devices 1052 in the voltage dividing device 105 to generate an analog signal VDA serving as an analog input voltage level of the first set of capacitor devices under the sampling phase. This voltage level is stored by the capacitor units of the first set of capacitor devices in terms of electric charges. The total electric charge amounts Qp and Qn can be described using the equations listed below. Please note that CT and CT′ represent capacitor units included in the first set of capacitor devices and the second set of capacitor devices, respectively; and the capacitance values thereof are represented by $C_{TP}$ and $C_{TN}$.

$$Qn=2^{(n-m)} \times C_{TN} \times (AGND1-AGND2), \text{ where } n=12 \text{ and } m=6 \quad (33)$$

$$Qp=2^{(n-m)} \times C_{TP} \times (AGND1-VDA), \text{ where } n=12 \text{ and } m=6 \quad (34)$$

The first set of capacitor devices is equivalent to an analog-to-digital converter with 6-bit resolution. After the analog input VDA from the voltage dividing device is received by the first set of capacitor devices under the sampling phase, the signal converting apparatus 100 enters the bit-cycling phase. The pertinent operation is detailed in many prior art references. Briefly summarized, the operation under the bit-cycling phase of the second self test mode is similar to that under the normal mode, and decodes the analog input VDA from MSBs to LSBs for obtaining a corresponding digital output code. In the end, C[5:0] is compared with $D_{out}[5:0]$. If C[5:0] is identical to $D_{out}[5:0]$, this indicates that the voltage dividing device implemented using a resistor string meets the 6-bit resolution requirement.

If each obtained $D_{out}[1:0]$ is 10 during the process under the first self test mode, and each obtained $D_{out}[5:0]$ is equal to C[5:0] during the process under the second self test mode, this implies that the designed analog-to-digital converter can meet the required precision requirements. Then, the complete built-in self test of the analog-to-digital converter is finished.

Figure 6:
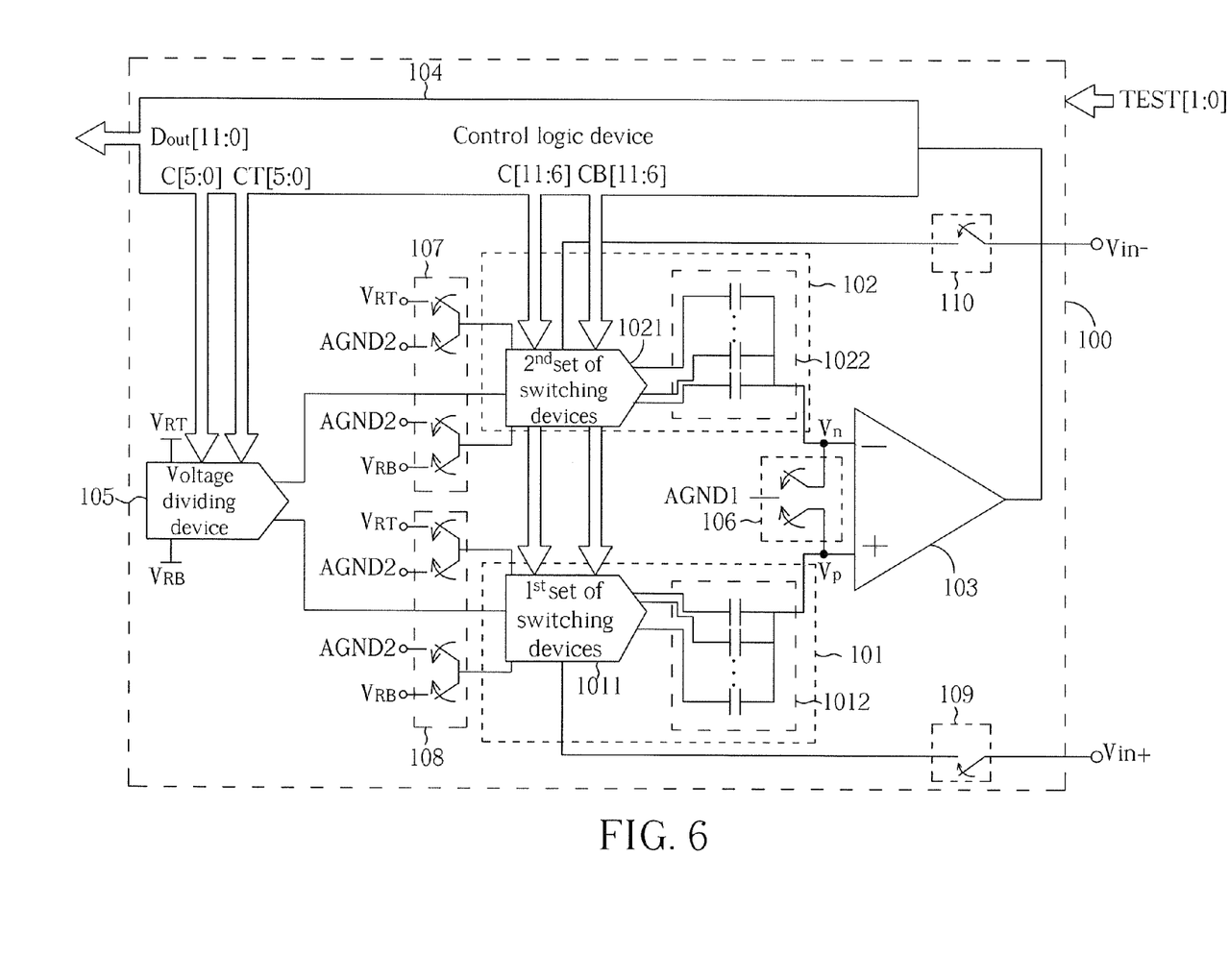
FIG. 6 is a simplified diagram illustrating a signal converting apparatus with built-in self test that is implemented using an architecture of an analog-to-digital converter with a differential input according to an exemplary embodiment of the present invention.

In above-mentioned exemplary embodiments of the present invention, the illustrated analog-to-digital converter has a single-ended input; however, this is for illustrative purposes only. For example, in an actual implementation, using an analog-to-digital converter with a different input is also feasible. A simplified diagram of this alternative implementation is shown in FIG. 6. As the test mode operation of the analog-to-digital converter with the different input is identical to that of an analog-to-digital converter having a single-ended input, further description is omitted here for brevity.

Those skilled in the art will readily observe that numerous modifications and alterations of the device and method may be made while retaining the teachings of the invention.

What is claimed is:

1. A signal converting apparatus with built-in self test, comprising:
   a comparing device, for comparing signals inputted to a first input terminal and a second input terminal to generate a comparing result;
   a first signal converting circuit, coupled to the first input terminal of the comparing device, for receiving a first reference voltage and a second reference voltage under a self test mode, and generating a first comparing signal to the first input terminal of the comparing device according to a first set of control signals;
   a second signal converting circuit, coupled to the second input terminal of the comparing device, for receiving the first reference voltage and the second reference voltage under the self test mode, and generating a second comparing signal to the second input terminal of the comparing device according to the first set of control signals;
   a voltage dividing device, coupled to the first and the second signal converting circuits, for generating at least an analog signal according to a second set of control signals to the first and the second signal converting circuits under the self test mode; and
   a control logic device, coupled to the comparing device, the first and the second signal converting circuits and the voltage dividing device, for generating the first and the second set of control signals.

2. The signal converting apparatus of claim 1, wherein the first signal converting circuit comprises:
   a first set of switching devices, having a first terminal coupled to the first reference voltage under the self test mode, and having a second terminal coupled to the second reference voltage under the self test mode, the first set of switching devices comprising a plurality of first switching elements coupled to the first set of control signals; and
   a first set of capacitor devices, having a first terminal coupled to the first set of switching devices, and having a second terminal selectively coupled to a third reference voltage, the first set of capacitor devices comprising a plurality of first capacitors and a first terminal capacitor, the plurality of first capacitors coupled to the plurality of first switching elements respectively, each of the first switching element utilized for controlling the first capacitor corresponding to the first switching element to couple to the first reference voltage or the second reference voltage.

3. The signal converting apparatus of claim 2, wherein the second signal converting circuit comprises:
   a second set of switching devices, having a first terminal coupled to the first reference voltage under the self test mode, and having a second terminal coupled to the second reference voltage under the self test mode, the second set of switching devices comprising a plurality of second switching elements coupled to the second set of control signals; and
   a second set of capacitor devices, having a first terminal coupled to the second set of switching devices, and having a second terminal selectively coupled to the third reference voltage, the second set of capacitor devices comprising a plurality of second capacitors and a second terminal capacitor, the plurality of second capacitors coupled to the plurality of second switching elements respectively, each of the second switching elements utilized for controlling the second capacitor corresponding to the second switching element to couple to the first reference voltage or the second reference voltage.

4. The signal converting apparatus of claim 3, wherein the voltage dividing device comprises:
   a voltage divider, coupled between the first and the second reference voltages, for providing a plurality of voltage levels;
   a third set of switching devices, coupled between the voltage divider and the first terminal capacitor, for selectively outputting an output voltage level from the plurality of voltage levels to the first terminal capacitor according to a specific set of control signals of the second set of control signals under the self test mode, the third set of switching devices comprising a plurality of third switching elements coupled to the second set of control signals; and
   a fourth set of switching devices, coupled between the voltage divider and the second terminal capacitor, for selectively outputting an output voltage level from the plurality of voltage levels to the second terminal capacitor according to another specific set of control signals of the second set of control signals under the self test mode, the fourth set of switching devices comprising a plurality of fourth switching elements coupled to the second set of control signals.

5. The signal converting apparatus of claim 4, further comprising:
   a fifth set of switching devices, coupled to the third reference voltage, the second terminal of the first set of capacitor devices and the second terminal of the second set of capacitor devices;
   wherein the fifth set of switching devices comprises a plurality of fifth switching elements utilized for controlling whether the second terminal of the first set of capacitor devices and the second terminal of the second set of capacitor devices are coupled to the third reference voltage; the first set and the second set of control signals outputted by the control logic device control the on/off status of the plurality of the first, the second, the third, the fourth, and the fifth switching elements for determining if an error between the first set of capacitor devices and the second set of capacitor devices conforms to a predetermined requirement according to a plurality of comparing results.

6. The signal converting apparatus of claim 5, wherein when the signal converting apparatus operates under a sampling phase of the self test mode, the control logic device outputs the first set and the second set of control signals for controlling the plurality of the fifth switching elements to couple the second terminal of the first set of capacitor devices and the second terminal of the second set of capacitor devices to the third reference voltage; and when the signal converting apparatus operates under a bit-cycling phase of the self test mode, the control logic device outputs the first set and the second set of control signals for controlling the plurality of the fifth switching elements to not couple the second terminal of the first set of capacitor devices and the second terminal of the second set of capacitor devices to the third reference voltage.

7. The signal converting apparatus of claim 6, wherein when the signal converting apparatus operates under the sampling phase or the bit-cycling phase, the control logic device outputs the first set and the second set of control signals to control at least a first switching element and a second switching element to couple a first capacitor and a second capacitor corresponding to the first capacitor to the first reference voltage.

8. The signal converting apparatus of claim 7, wherein when the signal converting apparatus operates under the sampling phase, the control logic device outputs the first set and the second set of control signals to control a third switching element and a fourth switching element to couple the second reference voltage to the first terminal capacitor and the second terminal capacitor.

9. The signal converting apparatus of claim 7, wherein when the signal converting apparatus operates under the bit-cycling phase, the control logic device outputs the first set and the second set of control signals for controlling a third switching element and a fourth switching element to couple a first voltage level and a second voltage level to the first terminal capacitor and the second terminal capacitor respectively under a first bit cycle of the bit-cycling phase, and the control logic device outputs the first set and the second set of control signals for controlling the third switching element and another fourth switching element to couple the first voltage level and a third voltage level to the first terminal capacitor and the second terminal capacitor respectively under a second bit cycle of the bit-cycling phase.

10. The signal converting apparatus of claim 9, wherein if the comparing result generated by the comparing device under the first bit cycle is equal to the comparing result generated under the second bit cycle, then the control logic device determines that the error between the first set of capacitor devices and the second set of capacitor devices does not conform to a predetermined requirement.

11. The signal converting apparatus of claim 9, wherein the first voltage level and the second voltage level are two adjacent voltage levels provided by the voltage divider, the first voltage level and the third voltage level are also two adjacent voltage levels provided by the voltage divider, and the second voltage level is different from the third voltage level.

12. The signal converting apparatus of claim 3, wherein the first set of capacitor devices is implemented by a dummy capacitor array that corresponds to the second set of capacitor devices.

* * * * *